(12) United States Patent  (10) Patent No.: US 8,124,925 B2
Young  (45) Date of Patent: Feb. 28, 2012

(54) SIMULATION DETECTOR HAVING MULTIPLE SENSOR SURFACES FOR DETECTING INCIDENT RADIATION

(75) Inventor: C. Gilbert Young, Winter Park, FL (US)

(73) Assignee: Lockheed Martin Corporation, Orlando, FL (US)

( * ) Notice: Subject to any disclaimer, the term of this patent is extended or adjusted under 35 U.S.C. 154(b) by 1359 days.

(21) Appl. No.: 11/680,856

(22) Filed: Mar. 1, 2007

(65) Prior Publication Data

US 2010/0059680 A1 Mar. 11, 2010

Related U.S. Application Data

(62) Division of application No. 11/225,751, filed on Sep. 13, 2005, now Pat. No. 7,576,311.

(51) Int. Cl.
*H01J 3/14* (2006.01)
*G01C 21/24* (2006.01)

(52) U.S. Cl. ..................................... 250/216; 250/203.1

(58) Field of Classification Search .................. 250/216, 250/221, 203.1, 203.2, 203.6, 338.1, 336.1, 250/340, 353; 434/19, 21, 22, 16, 11; 463/51, 463/52; 348/340, 341; 359/642, 664
See application file for complete search history.

(56) References Cited

U.S. PATENT DOCUMENTS

| 3,452,453 | A | * | 7/1969 | Ohlund ........................... 434/22 |
|---|---|---|---|---|
| 4,195,422 | A | * | 4/1980 | Budmiger ....................... 434/20 |
| 4,322,124 | A | * | 3/1982 | Padgitt et al. ................. 250/353 |
| 5,227,632 | A |   | 7/1993 | Armstrong et al. |
| 5,308,985 | A | * | 5/1994 | Lee ................ 250/353 |
| 5,670,774 | A | * | 9/1997 | Hill ............................ 250/203.4 |
| 5,788,500 | A | * | 8/1998 | Gerber ........................... 434/22 |
| 5,864,207 | A | * | 1/1999 | Kume et al. ................... 313/533 |
| 6,246,045 | B1 |   | 6/2001 | Morris et al. |
| 6,521,882 | B1 | * | 2/2003 | Sumiya et al. ............. 250/208.2 |
| 2006/0178830 | A1 |   | 8/2006 | Sherony |

* cited by examiner

*Primary Examiner* — Pascal M Bui Pho
(74) *Attorney, Agent, or Firm* — Withrow & Terranova, PLLC

(57) ABSTRACT

A detector having a field of view in elevation on the order of one hundred eighty degrees in one plane and three hundred sixty degrees in a perpendicular plane includes a generally hemispherical lens in combination with an optical frustum. The combination directs incident radiant energy within the field of view onto a centrally located sensor.

8 Claims, 2 Drawing Sheets

SIMULATION DETECTOR HAVING MULTIPLE SENSOR SURFACES FOR DETECTING INCIDENT RADIATION

CROSS-REFERENCE TO RELATED APPLICATION

This application is a Divisional applicant of U.S. Ser. No. 11/225,751 filed Sep. 13, 2005 entitled "Detector Having Wide Field of View", which is incorporated herein by reference.

FIELD

This invention pertains to optical sensors. More particularly, the invention pertains to such sensors that have fields of view on the order of one hundred eighty degrees and are responsive to incident radiant energy.

BACKGROUND

The Multiple Integrated Laser Engagement System (MILES) employs a suite of detectors on each target. The target may be an individual or a vehicle. The Individual Weapon Systems (IWS) include a vest employing 8 detectors, and a headband employing 4 detectors. The vehicle systems use one or more belts employing up to 8 detectors in each. In both cases the requirement is that the suite of detectors covers 360 degrees in azimuth.

The transmitted laser energy is kept as low as possible to minimize the eye-damage hazard. Because of this, the detectors need to be as sensitive as possible, within limits set by cost, size, weight, complexity, and downward compatibility in sensitivity.

Most of the MILES detectors in use today have evolved little since the inception of the MILES program several decades ago. These detectors employ a silicon active element behind a slightly-curved plastic cover, with an electromagnetic interference (EMI) filter interposed between the active element and the cover. The detector assembly is hermetically sealed to exclude the environment.

The silicon active element is specified to be 1+/−0.2 square centimeters in area. These detector assemblies are about 1⅝ inches in diameter and ⅝ inches high. They are hermetically sealed in a relatively heavy metal can having a glass window.

Because of the detector geometry and the optical properties of the cover, the field of view of the detectors is limited. Typical coverage in elevation is on the order of 60 degrees from a line normal to the detector. Detector sensitivity falls to 50 percent at 45 degrees from the normal. This means that at least four detectors are required on the headband to have 360 degrees of coverage with equal sensitivity in all azimuthal directions.

For the vest, four detectors in a square array are on the front of the individual, and another four detectors are on the individual's back, leaving azimuthal zones of 90 degrees on the right and left sides of the individual where the sensitivity falls to zero directly right and left.

There is thus an on-going need for detectors which can provide better coverage to thereby address above noted problems of known detectors. Preferably improved coverage could be achieved while at the same time reducing the total number of detectors that is needed.

DETAILED DESCRIPTION

Figure 1:
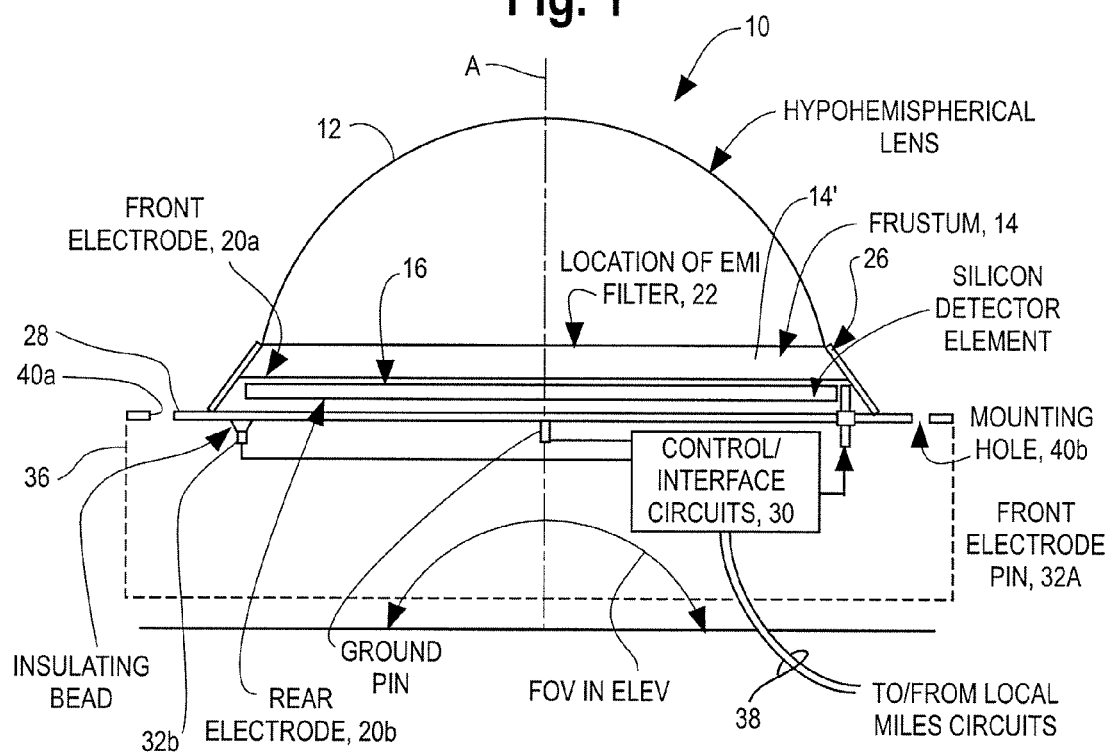
FIG. 1 is a side elevational view sectioned along an axis of symmetry of a detector in accordance with the present invention.

While this invention is susceptible of embodiment in many different forms, there are shown in the drawing and will be described herein in detail specific embodiments thereof with the understanding that the present disclosure is to be considered as an exemplification of the principles of the invention and is not intended to limit the invention to the specific embodiments illustrated.

In accordance with the invention, a detector has a 180 degree field of view (FOV) in elevation of effectively equal sensitivity in all azimuthal directions. This structure enables the use of two rather than four detectors on the headband, provides 360 degree, equal-sensitivity, azimuthal coverage by the vest, and reduces the number of detectors required on the vehicle systems.

Detectors which embody the invention are advantageously low-cost, small, light-weight and simple in design. An EMI shield and hermetic seal are preferably included.

One embodiment of a wide-FOV detector includes a hypohemispherical lens and an approximately 30 to 40 degree-to-the-symmetry-axis frustum of a cone in close proximity to a silicon detection element. An EMI shield is preferably interposed in the optical path, between the lens and the frustum. Preferably the lens has a thickness of about ¾ of the radius of a hemisphere.

The combination of a hypohemispherical lens and a frustum causes incident laser light from all angles to be refracted and reflected onto a silicon detector element. The sloping surface of the frustum is silvered or otherwise made highly reflective to the laser light. As a result, in the worst case, light that is adjacent to and parallel to the mounting surface will be refracted and reflected toward the detector element.

Light incident at smaller angles to the normal is refractively directed onto the detector element. The frustum is added to the lens so that all light rays are as nearly normal to the two (frustum and silicon) air/interface surfaces as possible. Light loss due to reflection at the interfaces is thereby reduced to a minimum.

The index of refraction of the silicon detection element is about 3.5, and that of low-cost plastic or glass optical materials suitable for use in fabricating the lens and frustum is about 1.5. Because of these large differences in indices of refraction a high percentage (equal to 32 percent at normal incidence and rising to 100 percent at 90 degrees to the normal) of the incident light would be reflected away from entering the detector element. If the indices of refraction of the lens and detector were the same the two elements could be bonded together with an index-matching adhesive, and the light loss due to reflection would be eliminated. However, there are no practical materials having an index of 3.5 that are available for use as the lens and frustum, or as the index-matching adhesive.

Appropriate anti-reflection (AR) coatings can be applied to the air-spaced facing surfaces of the frustum and silicon, or, if the frustum were to be bonded to the silicon an AR coating could be interposed between the two to reduce the otherwise 16 percent interfacial light loss at normal incidence. AR coatings can reduce the reflectivity to less than a percent, particularly if they are designed for use at a single wavelength, as would be the case where incoming radiant energy was emitted as monochromatic light by a laser source in a MILES-type system. AR coatings provide the best anti-reflective properties at normal incidence.

In the present application only light collection, and not image-forming is required. Hence, any unequal distribution of the light rays on the light sensing element is not a concern.

The lens and frustum could be injection-molded of acrylic, polycarbonate or other transparent optical plastics. The two elements can be cemented together using an index-matching adhesive.

The lens and/or frustum could also be made of glass. Glass lenses would be more resistant to scratches resulting from rough field use than plastic lenses. However, since the MILES detectors are light gatherers rather than image-making devices, the presence of scratches merely creates slight vignetting of the incoming energy, rather than creating undesired image distortion and/or artifacts.

A thin, open grid, metallic EMI screen can be located between the hypohemispheric lens and the frustum. It would be advantageous to chemically or otherwise deposit the screen on the optical element to minimize its thickness, and thereby minimize vignetting of near ninety degree incoming light. The screen needs to be electrically insulated from the silicon element so that the silicon is not short-circuited. The EMI screen can wrap around the edges of the frustum to complete a Faraday-cage EMI shield to the base.

A sun-blocking filter can be provided by doping the plastic lens material with an appropriate dye. If glass is used for the optical material, a thin optical filter can be located between the lens and the light sensing element.

The light sensing element is preferably round to match the geometry of the optics with an active diameter of about 1.13 centimeters. The active diameter of the light sensor must be equal to that of the extreme-angle light rays emerging from the frustum base in order to capture the maximum amount of incoming light at all angles.

In one aspect of the invention, the diameter of the optics/detector assembly can be determined so that the effective sensitivity is the same as that of known detectors. This will insure downward compatibility with existing MILES systems. Alternatively, the assembly can be enlarged to increase the effective sensitivity, thus reducing the required laser energy and reducing laser eye hazards.

In another aspect the total assembly can be mechanically captured and retained by means of a thin metal frustum. The frustum fits snugly over, and is cemented to, the optical frustum. This provides the conductive base for the assembly to complete the EMI Faraday-cage enclosure, as well as the hermetic seal. The resultant total assembly will be approximately one inch in diameter, and about one-half inch high. Detectors in accordance with the invention are much smaller, and lighter than most of the known MILES detectors.

Incident radiant energy is captured by the effective area of the detector optics in response to a given energy density created at the target by a laser transmitter. Because of its geometry a detector in accordance with the invention will present slightly more energy-capture area for incoming laser light at normal incidence than at +/−90-degrees. However, at 90 degrees at least two of the detectors can be expected to be responding simultaneously which minimizes this effect.

FIG. 1, a side section view of detector 10 in accordance with the invention (taken along a central axis A) illustrates various elements thereof. The detector 10 incorporates a generally hemispherical lens 12, which in a preferred embodiment is a hypohemispherical lens.

The lens 12 terminates at a frustum of a cone 14 which carries a reflective surface 14'. Preferably the frustum will be oriented at an angle on the order of 30 to 40 degrees relative to the axis A.

The frustum 14 is located adjacent to a preferably circular silicon sensing element 16. The element 16 is preferably symmetrical relative to the axis A and converts incoming radiant energy, for example monochromatic incident laser light, to electrical signals which can be sensed via front and rear electrodes 20a, 20b.

An EMI emissions filter 22 is preferably located between the lens 12 and sensor 16. An exterior mechanical frustum of a cone 26 can be electrically coupled to the filter 22 as well as to a metallic base plate 28 to form an EMI excluding chamber for the sensor 16. The filter or shield 22 can be found as a metallic screen.

Circuitry 30, as would be understood by those of skill in the art, can be coupled to connectors 32a and 32b which are electrically coupled to the respective front and rear electrodes 20a,b. The detector 10 can include a housing 36, indicated in phantom, and can be coupled to other local MILES circuitry via signal wires 38. The base plate 28 can be attached to the housing 36 via connectors such as screws or rivets through mounting holes 40a, 40b.

It will be understood that the detector 10 could be used with other types of systems or circuitry without limitation. Those of skill will also understand that the detector 10 could be used with incident radiant energy of a variety of wavelengths and which includes one or more wavelengths without limitation.

The lens 12 in combination with frustum 14 directs incident radiant energy, such as monochromatic light, from all angles by refraction and reflection onto the sensing element 16. The lens/frustum combination 12, 16 produces a field of view on the order of 180 degrees in elevation. Incident light which is parallel to the metallic base 28 can be refracted and reflected onto the detector element 16 as discussed subsequently relative to FIG. 2.

Figure 2:
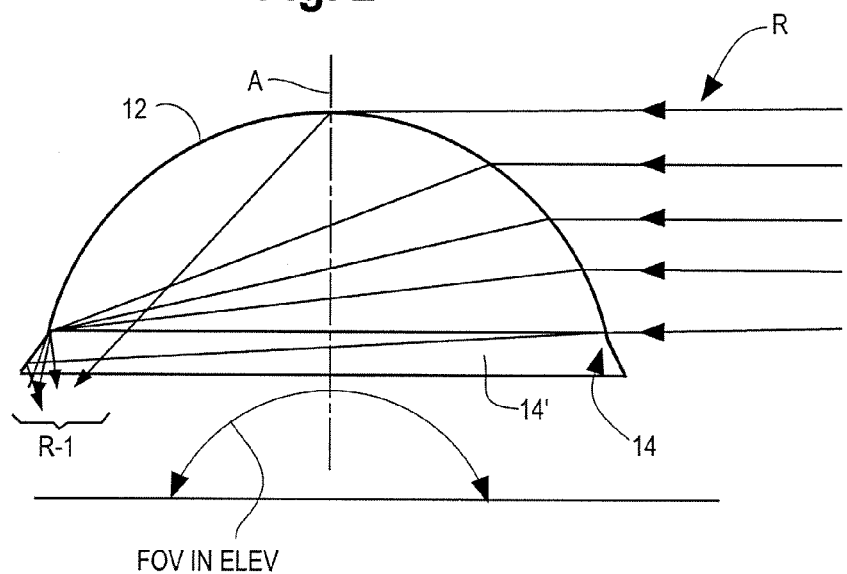
FIG. 2 is a side view of portions of the detector of FIG. 1 illustrating deflections of incoming radiant energy from a direction on the order of ninety degrees to a central axis of the detector.

As illustrated in FIG. 2, incident radiant energy R which is generally perpendicular to the axis of symmetry A is refracted by the lens 12 toward the frustum 14 from whence it is reflected onto the sensor 16. Incident radiant energy parallel to the axis A or at a lesser angle than 90 degrees relative to the axis A may only be refracted by the lens 12 onto the sensing element 16.

In the detector 10, slight losses due to reflection at the interfaces between the lens 12 and frustum 14 can be reduced to a minimum by cementing them together with an index-matching adhesive. Light losses due to reflection at the frustum and silicon air/interface surfaces are reduced to a minimum because the incoming light rays are as nearly normal to the surfaces as possible. If desired, appropriate anti-reflective coatings can also be applied to the air-space facing surfaces of the frustum 14 and the sensor 16. If the frustum 14 is bonded to the sensor 16 an antireflective coating can be interposed between the two to reduce light losses of the interface at normal incidents.

Where the lens 12 is formed of plastic, a sun-blocking filter can be provided by incorporating an appropriate dye into the resin. Where glass is used for the optical material for the lens 12 an optical filter can be located between the lens 12 and the sensor 16.

As illustrated in FIG. 2, the light rays incident from the right of the detector 10 impinge on the left edge of the sensor 16, see rays R-1 of FIG. 2. The reverse is also true for parallel light beams incident and arriving from the left side of the lens 12. Rays incident on the top of the lens 12 arrive at a central portion of the sensor 16.

Figure 3:
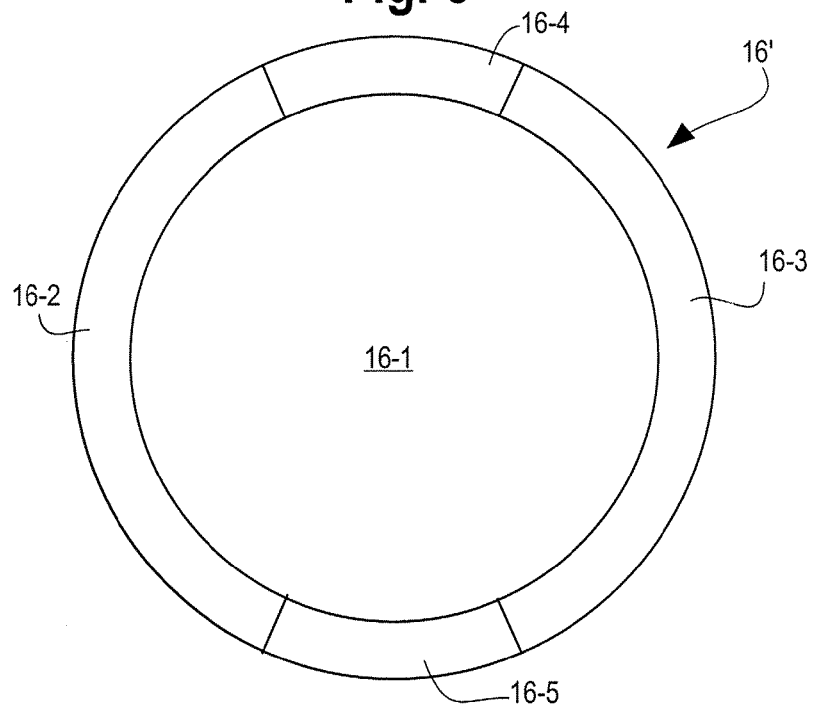
FIG. 3 is a top plan view of one form of a sensor usable with the detector of FIG. 1.

The detector 10 can determine the direction from which incident radiant energy, for example laser light, is coming using a multi-element sensor 16' as illustrated in FIG. 3. The sensor 16' incorporates a central portion 16-1 which receives light rays or radiant energy generally incident on the top of the lens 12.

Incoming radiant energy from greater angles relative to the axis A, as illustrated in FIG. 2, for example, will be incident upon separate sensor surfaces such as 16-2, 16-3, 16-4 or 16-5. If desired the elements 16-2, 16-3, 16-4 and 16-5 can all extend accurately across a common angle relative to the axis A. Thus, incident radiant energy R-1 which impinges upon sensor region 16-2 can be recognized by circuitry 30 as incoming generally from the right side of the detector 10. Similarly radiant energy incident upon the sensor region 16-3 can be determined via circuitry 30 as generally incoming from the left side of the detector 10. Similar comments apply to incident radiant energy impinging upon regions 16-4, 16-5.

Figure 4:
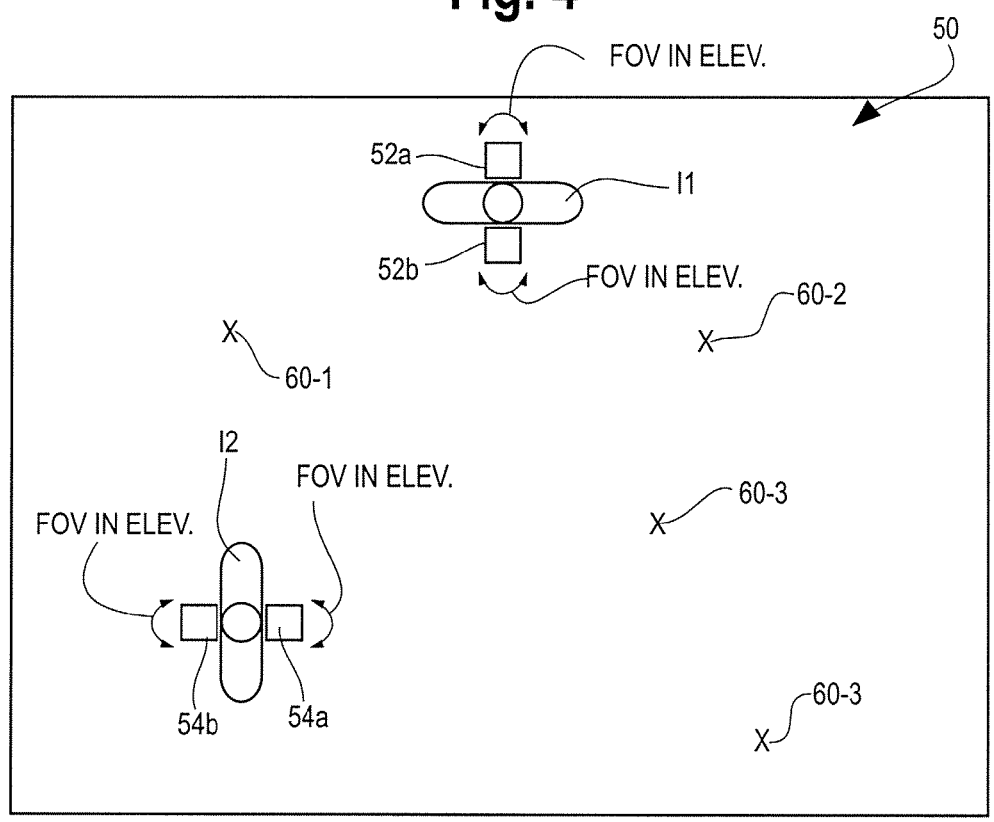
FIG. 4 illustrates a simulation system which incorporates detectors in accordance with the present invention.

FIG. 4 illustrates usage of detectors, such as the detector 10, in a MILES-type simulation system 50. In the disclosed system 50 individuals I1, I2 are participating in the simulation and wear or carry first and second detectors 52a,b, 54a,b corresponding to the detector 10. The detectors 52a,b each have a field of view in elevation on the order of 180 degrees in all azimuthic directions. As illustrated, the individual I1 need only carry two detectors. Similar comments to the configuration of detectors 54a,b carried by the individual 12. Vehicles participating in the simulation indicated generally at 60-1, 60-2, 60-3, and 60-4 could carry four detectors corresponding to the detector 10 each of which would have a 180 degree field of view in elevation in all asymmetric directions.

From the foregoing, it will be observed that numerous variations and modifications may be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

The invention claimed is:

1. A simulation system comprising:
a plurality of detectors configured to individually detect incident radiation in a field of view in elevation on an order of one hundred eighty degrees, a detector of the plurality of detectors including a sensor comprising a circular perimeter and multiple sensor surfaces to detect the incident radiation within the field of view, wherein each of a plurality of the multiple sensor surfaces has a first edge abutting the circular perimeter, and second and third edges abutting edges of others of the plurality of the multiple sensor surfaces, the detector configured to:
refract, via a hypohemispherical lens, a portion of the incident radiation towards an interior surface of a reflective frustum, the reflective frustum circumscribing the circular perimeter;
reflect, by the interior surface of the reflective frustum, the portion of the incident radiation onto at least one of the sensor surfaces;
convert the portion of the incident radiation to an electrical signal; and
sense the electrical signal; and
a plurality of weapon mounted, moveable sources of beams of radiant energy with wavelengths in a wavelength range detectable by the plurality of detectors.

2. A simulation system as in claim 1 with the plurality of detectors distributable across a selected field of regard.

3. A simulation system as in claim 1 wherein at least some of the plurality of detectors each include a hemispheric lens.

4. A simulation system as in claim 1 wherein at least some of the plurality of detectors are carried by an individual such that the radiant energy emitted in a direction of the individual from any angle may be detected.

5. A simulation system as in claim 1 wherein at least some of the plurality of detectors are mounted to a vehicle such that the radiant energy emitted in a direction of the vehicle from any angle may be detected.

6. A method of simulation comprising:
detecting, by a detector including a sensor comprising a circular perimeter and multiple sensor elements, each of a plurality of the multiple sensor elements having a first edge abutting the circular perimeter, and second and third edges abutting edges of others of the plurality of the multiple sensor elements, each sensor element of the multiple sensor elements operative to detecting incident radiation thereon independently of each other sensor element of the multiple sensor elements, the at least one beam of radiant energy emitted from a moveable light source in the range in a field of view in elevation on an order of one hundred eighty degrees;
refracting, via a hypohemispherical lens, a portion of the at least one beam of radiant energy towards an interior surface of a reflective frustum, the reflective frustum circumscribing the circular perimeter;
reflecting, by the interior surface of the reflective frustum, the portion of the at least one beam of radiant energy onto at least one of the sensor elements;
converting the at least one beam of radiant energy to electrical signals;
sensing the electrical signals; and
determining a direction of the at least one beam of radiant energy based on which sensor element of the multiple sensor elements detected the incident radiation.

7. The simulation system of claim 1, wherein a first sensor surface of the multiple sensor surfaces adjoins a second sensor surface of the multiple sensor surfaces.

8. A simulation detector comprising:
a plurality of sensor surfaces, each sensor surface abutting at least two other of the plurality of sensor surfaces, a circular perimeter circumscribing the sensor surfaces;
a hypohemispherical lens configured to refract incident radiation received from a weapon-mounted radiation source onto a particular one of the plurality of the sensor surfaces based on an origination direction of the incident radiation;
circuitry configured to indicate the origination direction of the incident radiation based on the one of the plurality of sensor surfaces on which the incident radiation is refracted; and
wherein the detector is configured to:
refract, via the hypohemispherical lens, a portion of the incident radiation towards an interior surface of a reflective frustum, the reflective frustum circumscribing the circular perimeter;
reflect, by the interior surface of the reflective frustum, the portion of the incident radiation onto at least one of the sensor surfaces;
convert the portion of the incident radiation to an electrical signal; and
sense the electrical signal.

* * * * *